United States Patent
Lee et al.

(10) Patent No.: US 7,745,305 B2
(45) Date of Patent: Jun. 29, 2010

(54) METHOD OF REMOVING AN OXIDE AND METHOD OF FILLING A TRENCH USING THE SAME

(75) Inventors: Seung-Heon Lee, Seoul (KR); Kyu-Tae Na, Seoul (KR); Ju-Wan Kim, Seongnam-si (KR); Taek-Jung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 173 days.

(21) Appl. No.: 12/007,640

(22) Filed: Jan. 14, 2008

(65) Prior Publication Data

US 2008/0182383 A1 Jul. 31, 2008

(30) Foreign Application Priority Data

Jan. 31, 2007 (KR) .................. 10-2007-0009880

(51) Int. Cl.
*H01L 21/76* (2006.01)
(52) U.S. Cl. ............... 438/437; 438/291; 438/296; 438/424; 438/477; 257/E21.252; 257/E21.293

(58) Field of Classification Search ............ 438/477, 438/708
See application file for complete search history.

(56) References Cited

U.S. PATENT DOCUMENTS

| 5,766,971 A * | 6/1998 | Ahlgren et al. ............ 438/296 |
| 7,183,214 B2 | 2/2007 | Nam et al. |
| 2005/0074948 A1 | 4/2005 | Ko et al. |
| 2008/0171438 A1* | 7/2008 | Sinha et al. ............... 438/689 |

FOREIGN PATENT DOCUMENTS

| KR | 10-2005-0055074 A | 6/2005 |
| KR | 10-2005-0067555 A | 7/2005 |
| KR | 10-2006-0104232 A | 10/2006 |

* cited by examiner

*Primary Examiner*—N Drew Richards
*Assistant Examiner*—Kyoung Lee
(74) *Attorney, Agent, or Firm*—Lee & Morse P.C.

(57) ABSTRACT

A method of removing a portion of an oxide layer includes forming first byproducts by reacting a reaction gas with the oxide layer, the reaction gas including fluorine and nitrogen, reacting the reaction gas with the first byproducts to form second byproducts, and removing the second byproducts.

15 Claims, 4 Drawing Sheets ature of the present invention to provide a method of removing a portion of an oxide layer, while causing minimized damage to adjacent components.
METHOD OF REMOVING AN OXIDE AND METHOD OF FILLING A TRENCH USING THE SAME

BACKGROUND OF THE INVENTION

1. Field of the Invention

Embodiments of the present invention relate to a method of removing an oxide and a method of filling a trench using the same. More particularly, embodiments of the present invention relate to a method of removing a portion of an oxide layer and a method of filling a trench using the same without forming voids and/or seams therein.

2. Description of the Related Art

Semiconductor devices may require high speed and large storage capacity in order to provide proper functioning. Accordingly, a method of manufacturing the semiconductor devices may require forming semiconductor devices with high density, reliability, and response speed. A conventional method of manufacturing semiconductor devices may include formation of a device isolation region, i.e., a region determining a size of an active region of a semiconductor device and a margin thereof, in a substrate, so electrical components, e.g., a diode, a transistor, and so forth, may be formed in the active region of the substrate.

A conventional device isolation process may include a thermal field oxidation process, e.g., a local oxidation of silicon (LOCOS) process. In a conventional LOCOS process, oxide and nitride layers may be formed sequentially on a substrate, followed by patterning of the nitride layer to form an anti-oxidation mask. The anti-oxidation mask may be used to selectively oxidize the substrate to form a field oxide layer, i.e., device isolation, thereon. However, the conventional LOCOS process may cause penetration of the oxide layer through peripheral portions of the anti-oxidation mask, thereby causing formation of a bird's beak at peripheral portions of the field oxide layer. As such, the field oxide layer may overlap an active region of the substrate, thereby reducing a width of the active region and degrading electrical characteristics thereof.

Another example of a conventional device isolation process may include a shallow trench isolation (STI) structure. A conventional STI structure may include deposition of an oxide layer inside a trench formed in a semiconductor substrate, followed by wet etching or plasma etching to remove a portion of the oxide layer. However, an increased integration of the semiconductor device may require a reduced size of the active/field regions, thereby requiring an increased aspect ratio of the trench, i.e., a ratio of width to depth. Deposition of an oxide layer in a trench having a high aspect ratio may be difficult and non-uniform, so voids and/or seams may be formed in the oxide layer inside the trench.

For example, if high density plasma chemical vapor deposition (HDP-CVD) is used to form the oxide layer in the trench, deposition and sputtering may be performed at the same time. Accordingly, the oxide layer deposited in an upper portion of the trench may be sputtered and reattached, thereby causing non-uniform deposition. In other words, since a deposition speed of the oxide layer in a vertical direction may be faster than a deposition speed of the oxide layer in a horizontal direction, voids and/or seams may be formed in the oxide layer inside the trench. Attempts have been made to minimize formation of voids and/or seams in an oxide layer formed via a HDP-CVD by using a hydrogen gas. However, use of the hydrogen gas may cause an active pitting phenomenon, i.e., local pitting of an active region, thereby triggering defective operation of a unit device corresponding to the active region. Such defective operation may decrease reliability and production yield of the semiconductor device.

Further, use of wet etching or plasma etching to remove a portion of the oxide layer from the trench in a conventional STI structure process may cause excessive etching, thereby causing damage to the semiconductor device. Attempts have been made to minimize excessive damage by using a liner or reducing RF power. However, such methods may degrade gap-fill ability of the oxide layer in the trench, thereby increasing voids and/or seams in the oxide layer inside the trench.

SUMMARY OF THE INVENTION

Embodiments of the present invention are therefore directed to a method of removing an oxide and a method of filling a trench using the same, which substantially overcome one or more of the disadvantages of the related art.

It is therefore a feature of an embodiment of the present invention to provide a method of removing a portion of an oxide layer, while causing minimized damage to adjacent components.

It is another feature of an embodiment of the present invention to provide a method of filling a trench with minimized voids and/or seams therein.

At least one of the above and other features and advantages of the present invention may be realized by providing a method of removing a portion of an oxide layer including an oxide, the method including forming first byproducts by reacting a reaction gas with the oxide of the oxide layer, the reaction gas having fluorine and nitrogen, reacting the reaction gas with the first byproducts to form second byproducts, and removing the second byproducts.

The reaction gas may include a hydrofluoric acid (HF) vapor and an ammonia (NH3) gas. Forming the first byproducts may include forming fluorinated silicon (SiF4), and forming the second byproducts may include forming ammonium fluorosilicate ((NH4)2SiF6). A fluid flow ratio of the ammonia (NH3) gas to the hydrofluoric acid (HF) vapor may be about 1:0.8 to about 1:1.2. The oxide layer may include one or more of an undoped silicate glass (USG) layer, an $O_3$-tetraethylorthosilicate ($O_3$-TEOS) layer, a thermal oxide layer, a phosphosilicate glass (PSG) layer, a borophosphosilicate glass (BPSG) layer, and/or a high density plasma (HDP) oxide layer.

At least one of the above and other features and advantages of the present invention may be further realized by providing a method of filling a trench, the method including forming at least one first trench to extend from an upper surface of a substrate in a downward direction, forming a first oxide layer conformably on the substrate, such that the first trench is partially filled with the first oxide layer, removing a portion of the first oxide layer by reacting a reaction gas including fluorine and nitrogen with the first oxide layer to form a partially etched first oxide layer, the partially etched first oxide layer defining at least one second trench, and forming a second oxide layer on the partially etched first oxide layer, such that the second trench is filled with the second oxide layer, wherein removing a portion of the first oxide layer includes forming first byproducts via a reaction between the first oxide layer and the reaction gas, reacting the first byproducts with the reaction gas to form second byproducts, and removing the second byproducts.

The reaction gas may include a hydrofluoric acid (HF) vapor and an ammonia ($NH_3$) gas. A fluid flow ratio of the ammonia ($NH_3$) gas to the hydrofluoric acid (HF) vapor may be about 1:0.8 to about 1:1.2. Forming the first byproducts may include forming fluorinated silicon ($SiF_4$), and forming the second byproducts may include forming ammonium fluorosilicate ($(NH_4)_2SiF_6$). The first oxide layer and the second oxide layer may include one or more of undoped silicate glass (USG) layer, an $O_3$-tetraethylorthosilicate ($O_3$-TEOS) layer, a thermal oxide layer, a phosphosilicate glass (PSG) layer, a borophosphosilicate glass (BPSG) layer, and/or a high density plasma (HDP) oxide layer.

Forming a partially etched first oxide layer to define the second trench may be performed at a temperature of about 30° C. to about 40° C. Forming a partially etched first oxide layer to define the second trench may be performed at a pressure of about 50 mTorr to about 100 mTorr. Removing a portion of the first oxide layer to form a partially etched first oxide layer may include defining the second trench to have a sidewall slope of about 85° to about 87°. Forming the first oxide layer may include setting a width of the first trench and a thickness of the first oxide layer to have a ratio of about 1:0.2 to about 1:0.8. Forming the first trench may include forming a trench having a ratio of the width and a depth of about 1:3 to about 1:20. Forming the second oxide layer may include forming the second oxide layer to have a thickness of about 5,500 angstroms to about 6,500 angstroms. The method may further include thermally treating the second oxide layer to reflow the second oxide layer into the second trench. Forming the first trench may include forming a mask pattern on the substrate and etching the substrate using the mask pattern. The method may further include planarizing the second oxide layer to expose the mask pattern. Forming the mask pattern may include stacking a pad oxide pattern and a pad nitrogen pattern on the substrate.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION OF THE INVENTION

Figure 1:
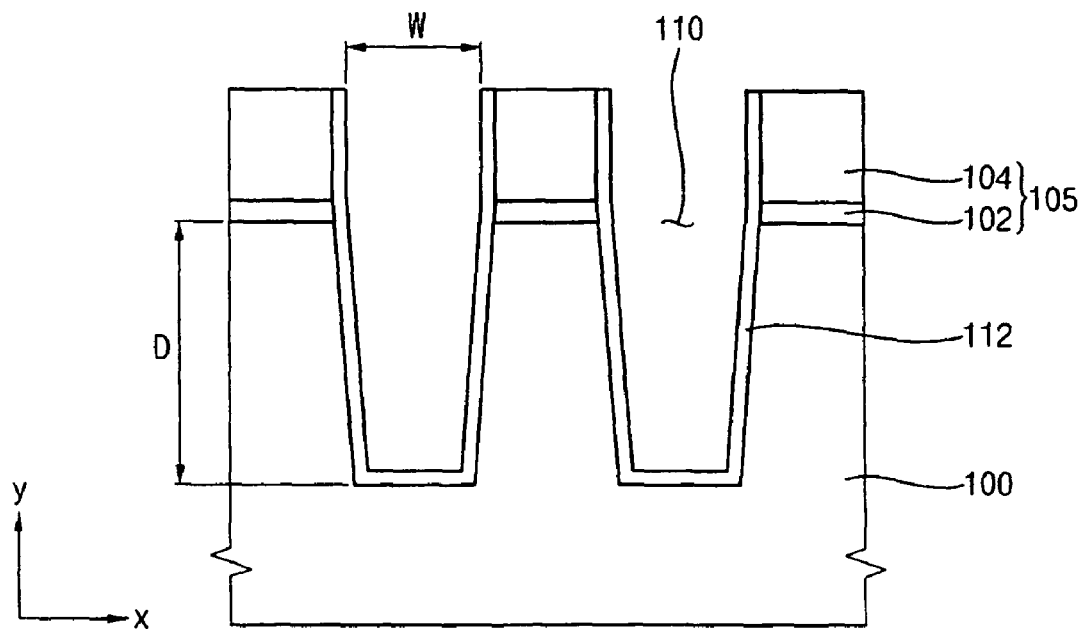
FIGS. 1-7 illustrate cross-sectional views of stages in a method of filling a trench according to an embodiment of the present invention.

Korean Patent Application No. 10-2007-0009880, filed on Jan. 31, 2007 in the Korean Intellectual Property Office, and entitled: "Method of Removing Oxide and Method of Filling a Trench Using the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

An exemplary embodiment of a method for removing a portion of an oxide layer including an oxide may be as follows.

A reaction gas may be applied to the oxide layer formed on a substrate, so the reaction gas may chemically react with the oxide layer to form byproducts. The oxide layer may include an oxide, e.g., a silicon oxide. Examples of the oxide layer may include one or more of an undoped silicate glass (USG) layer, an $O_3$-tetraethylorthosilicate ($O_3$-TEOS) layer, a thermal oxide layer, a phosphosilicate glass (PSG) layer, a borophosphosilicate glass (BPSG) layer, a high density plasma (HDP) oxide layer, and so forth. The reaction gas may include fluorine, e.g., a hydrofluoric acid (HF) vapor, and nitrogen, e.g., an ammonia ($NH_3$) gas. Accordingly, the reaction gas may interact with the oxide of the oxide layer to form byproducts, e.g., according to Reaction Equation 1 below, so, e.g., fluorinated silicon ($SiF_4$) and water ($H_2O$), may be formed as byproducts.

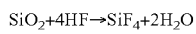

$$SiO_2 + 4HF \rightarrow SiF_4 + 2H_2O \qquad \text{Reaction Equation 1}$$

Once the byproducts are formed, the byproducts may be removed by a reaction between the byproducts and the reaction gas according to, e.g., Reaction Equation 2. For example, as the $SiF_4$ formed according to Reaction Equation 1 is reacted with the reaction gas according to Reaction Equation 2, ammonium fluorosilicate ($(NH_4)_2SiF_6$) may be formed.

$$SiF_4 + 2HF + 2NH_3 \rightarrow (NH_4)_2SiF_6 \qquad \text{Reaction Equation 2}$$

It is noted that according to Reaction Equations 1-2, the ammonia gas of the reaction gas may react only with fluorinated silicon ($SiF_4$) of the byproducts to form ammonium salt, i.e., there is substantially no direct reaction between the ammonia gas and the silicon oxide ($SiO_2$). The ammonium salt formed may be removed from the oxide layer, thereby removing the oxide, e.g., $SiO_2$, from the oxide layer.

Removing a portion of an oxide layer with a reaction gas according to embodiments of the present invention may be advantageous because the reaction gas may chemically interact with the oxide of the oxide layer, thereby facilitating isotropic etching of the oxide layer. As such, damage caused by wet-etching, e.g., excessive etching, or by plasma etching, e.g., damage due to bias voltage, when removing undesired portions of the oxide layer may be prevented and/or substantially minimized.

An exemplary embodiment of a method for filling a trench is described in more detail below with reference to FIGS. 1-7.

Referring to FIG. 1, a mask pattern 105 may be formed on a substrate 100, and the substrate 100 may be etched using the mask pattern 105 to form a first trench 110. The substrate 100 may be any suitable substrate, e.g., a substrate including silicon.

More specifically, a pad oxide layer (not shown) may be formed on an upper surface of the substrate 100. The pad oxide layer may have a thickness of about 50 angstroms to about 200 angstroms, e.g., a thickness of about 100 angstroms as measured from the upper surface of the substrate 100 along the y-axis. The pad oxide layer may reduce stress generated on the substrate 100 when a pad nitride layer is formed thereon. The pad oxide layer may be formed by, e.g., a thermal oxidation process or a chemical vapor deposition (CVD) process.

A pad nitride layer (not shown) may be formed on the substrate 100, i.e., on an upper surface of the pad oxide layer. The pad nitride layer may include, e.g., silicon nitride, and may be formed by, e.g., a plasma-enhanced chemical vapor deposition (PECVD) process or a low pressure chemical vapor deposition (LPCVD) process using an ammonia ($NH_3$) gas, a silane ($SiH_4$) gas, a dichlorosilane ($SiH_2Cl_2$) gas, and so forth.

A photoresist pattern (not shown) may be formed on the pad nitride layer. The photoresist pattern may be formed by coating a photoresist composition on the pad nitride layer to a substantially uniform thickness, baking the photoresist composition to form a photoresist film (not illustrated), and exposing and developing the photoresist film to form a predetermined pattern. The photoresist pattern may be used to remove portions of the pad nitride layer and pad oxide layer. Accordingly, the pad nitride layer may be patterned to correspond to the photoresist pattern to form a pad nitride pattern 104, and the pad oxide layer may be patterned to correspond to the photoresist pattern to form a pad oxide pattern 102. The photoresist pattern may be removed by, e.g., an ashing process and/or a strip process.

As illustrated in FIG. 1, the pad oxide pattern 102 and the pad nitride pattern 104 may be sequentially stacked on the substrate 100 to form the mask pattern 105. The mask pattern 105 may be used to define a region for forming a floating gate and for forming an isolation trench. Accordingly, portions of the substrate 100 exposed by the mask pattern 105 may be etched to form a plurality of first trenches 110. The first trenches 110 may extend in a downward direction from the upper surface of the substrate 100, i.e., an interface between the substrate 100 and the pad oxide pattern 102, to a predetermined depth.

The first trench 110 may have a width W of about 400 angstroms to about 500 angstroms along the x-axis, and may have a depth D of about 1,500 angstroms to about 8,000 angstroms along the y-axis. That is, an aspect ratio of the first trench 110, i.e., a ratio between the width W and depth D of the first trench 110, may be about 3 to about 20. The width W of the first trench 110 may be measured at an entrance portion of the first trench 110, i.e., an upper-most portion of the first trench 110. The width of the first trench 110 may be non-uniform, so the upper-most portion of the first trench 110 may be wider than a lower portion thereof. The depth D of the first trench 110 may be measured from the upper surface of the first trench 110.

Forming the first trenches 110 to extend from the upper surface of the substrate 100 may facilitate formation of an active region and a field region, i.e., an isolation layer, in the substrate 100. The substrate 100 may include a cell region, i.e., a region including a high density of the first trenches 110, and a peripheral region, i.e., a region including a lower density of the first trenches 110 as compared to the cell region. The width W of the first trenches 110 in the peripheral region may be wider than the width W of the first trenches 110 in the cell region.

As further illustrated in FIG. 1, a liner layer 112 may be formed inside the first trenches 110 in order to prevent and/or substantially minimize potential leakage current or other damage to the substrate 100 caused by formation of the first trench 110. The liner layer 112 may be formed to coat inner side surfaces and an inner bottom surface of the first trenches 110 by, e.g., thermal treatment of the silicon substrate 100 or by depositing a separate nitride-containing layer on the substrate 100. If the liner layer 112 is formed by thermal treatment, the thermal treatment may be performed at a temperature of about 740° C. to about 760° C. in order to form the liner layer 112 to have a thickness of about 90 angstroms to about 100 angstroms.

Figure 2:
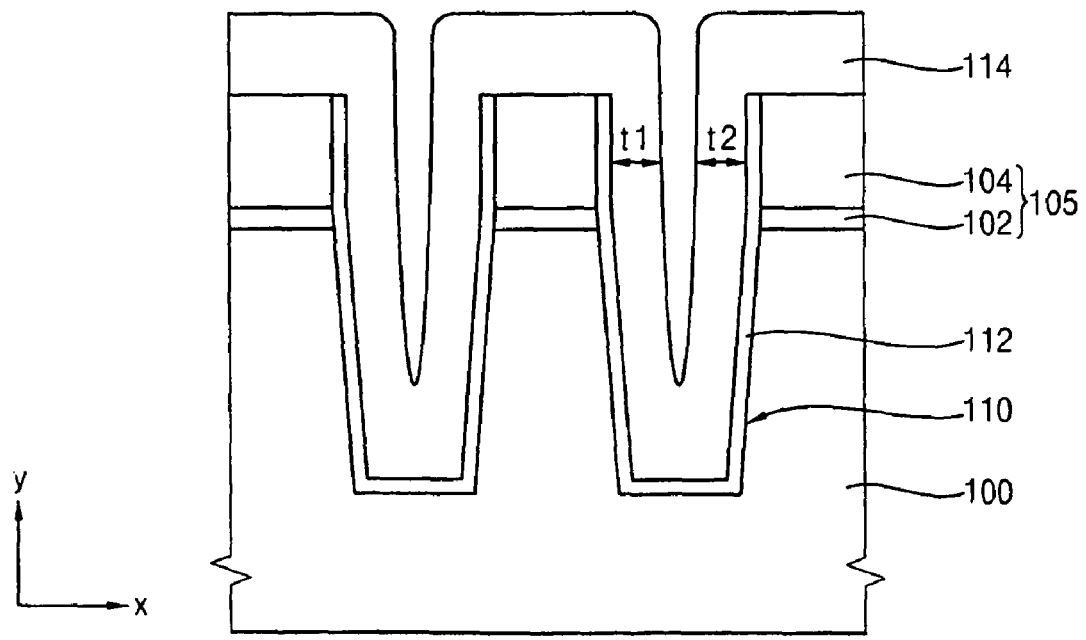

Referring to FIG. 2, a first oxide layer 114 may be formed on the substrate 100. More specifically, the first oxide layer 114 may be formed conformably along an upper surface of the mask pattern 105 and inner side and bottom surfaces of the first trenches 110. For example, the first oxide layer 114 may have horizontal portions on the upper surface of the pad nitride pattern 104 and vertical portions on the liner layer 112. The first oxide layer 114 may fill the first trenches 110 only partially, so a space may be formed in the first trench 110 between two adjacent vertical portions of the first oxide layer 114, i.e., two portions of the first oxide layer 114 on adjacent and facing side surfaces of a single trench 110, as further illustrated in FIG. 2. The space may extend to an upper surface of the first oxide layer 114, so the first oxide layer 114 may not overhang the space.

The first oxide layer 114 may include, e.g., silicon oxide. Examples of the first oxide layer 114 may include one or more of an undoped silicate glass (USG) layer, an $O_3$-tetraethylorthosilicate ($O_3$-TEOS) layer, a thermal oxide layer, a phosphosilicate glass (PSG) layer, a borophosphosilicate glass (BPSG) layer, and/or a high-density plasma (HDP) oxide layer. For example, use of a USG layer in the first oxide layer 114 may impart superior step-coverage and filling properties thereto, thereby substantially minimizing voids and/or seams in the first trench 110 despite a high aspect ratio thereof. Further, forming the USG layer by using $O_3$-TEOS as a source gas may impart superior flatness, e.g., thickness uniformity, thereto, as compared, e.g., to an oxide layer formed by silane ($SiH_4$) plasma.

The first oxide layer 114 may be formed by, e.g., CVD at a temperature of about 500° C. to about 600° C. under pressure of about 550 torr to about 700 torr. If CVD is used to form the first oxide layer 114, oxygen ($O_2$) and a silane gas ($SiH_4$) may be used as source gases. A deposition speed of the first oxide layer 114 in a vertical direction, i.e., along the y-axis, may be faster than a deposition speed of the first oxide layer 114 in a horizontal direction, i.e., along the x-axis. Accordingly, the first oxide layer 114 may be deposited to have a higher thickness on a bottom portion of the first trench 110 along the y-axis than on side surfaces of the first trench 110 along the x-axis. That is, a ratio of the width W of the first trench 110 to the thickness of the first oxide layer 114 along side surfaces of the first trench 110, i.e., along the x-axis, may be about 5:1 to about 1.25:1. If the width W of the first trench 110 is about 400 angstroms to about 500 angstroms, the thickness of the first oxide layer 114 may be about 150 angstroms to about 300 angstroms. The thickness of the first oxide layer 114 may refers to a combined thickness of both vertical portions of the first oxide layer 114, i.e., the thickness substantially equals a sum of t1 and t2. The thicknesses t1 and t2 may or may not be equal to each other.

Figure 3:
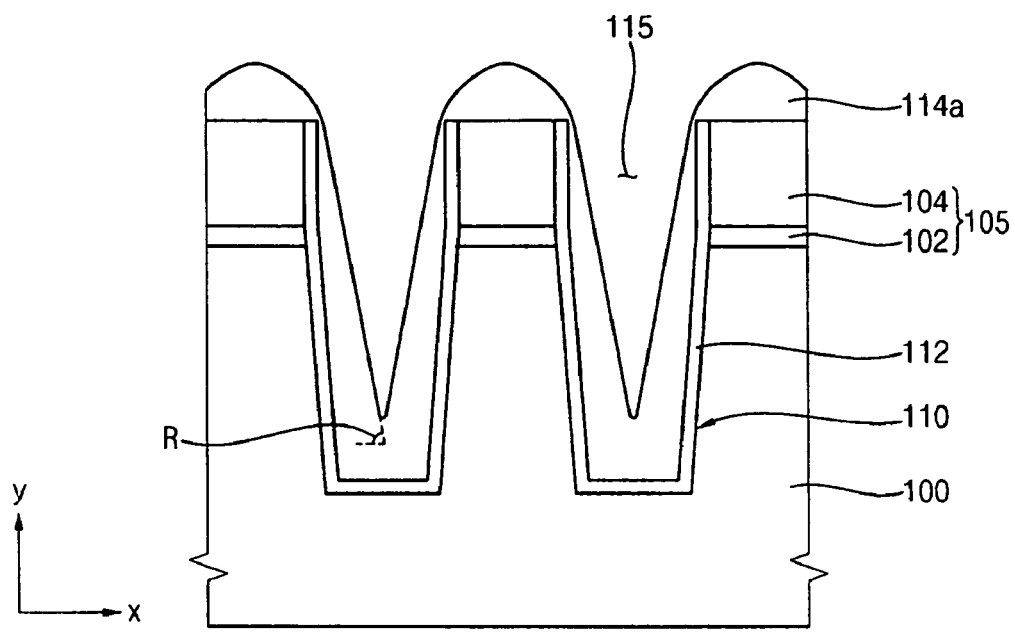

Referring to FIG. 3, a portion of the first oxide layer 114 may be etched using a reaction gas as described previously with respect to a method for removing a portion of an oxide layer to form a plurality of second trenches 115 in a first oxide layer residue 114a. That is, after etching the first oxide layer 114, a first oxide layer residue 114a may remain on an upper surface of the mask pattern 105 and inside the first trenches 110 to define the plurality of second trenches 115. A width of the second trenches 15 along the x-axis may increase as a distance from the substrate 100 increases.

Hereinafter, a process of forming the second trenches 115 will be explained in more detail. First, a reaction gas including fluorine and nitrogen may be provided to interact with the first oxide layer 114, so byproducts may be formed according to, e.g., Reaction Formula 1, as described above. If the reaction gas includes a hydrofluoric acid (HF) vapor and an ammonia ($NH_3$) gas, a fluid flow ratio of the $NH_3$ gas to the HF vapor may be about 1:0.8 to about 1:1.2. For example, the HF vapor and the $NH_3$ gas may be provided at a fluid flow of about 30 sccm and about 50 sccm, respectively, for about 80 seconds to about 100 seconds. Argon (Ar) gas may be provided with the $NH_3$ gas and/or the HF vapor as a carrier gas at a fluid flow of about 80 sccm to about 120 sccm for about 80 seconds to about 100 seconds. Accordingly, the HF vapor may react with the first oxide layer 114 to form byproducts, and the $NH_3$ gas may react with the byproducts, i.e., fluorinated silicon ($SiF_4$), to form ammonium salt. Details regarding the reaction gas, byproducts, and Reaction Equations 1-2 may be substantially similar to the details described previously, and therefore, will not be repeated. The ammonium salt may be removed from the first oxide layer 114 to form the first oxide layer residue 114a with a plurality of second trenches 115 therein. The first oxide layer residue 114a, i.e., second trenches 115, may be formed at a temperature of about 30° C. to about 40° C. and at a pressure of about 50 mTorr to about 100 mTorr. An amount of removed oxide may be controlled according to stoichiometric data of Reaction Equations 1-2.

The second trenches 115 may have an enlarged sidewall slope at an entrance thereof. That is, the vertical portions of the first oxide layer 114 in the first trenches 110 may be substantially perpendicular with respect to the substrate 100, as illustrated in FIG. 2. After etching the first oxide layer 114 with the reaction gas, vertical portions of the first oxide layer residue 114a, i.e., portions defining side surfaces of the second trenches 115, may be angled with respect to the substrate 100, as illustrated in FIG. 3. More specifically, the vertical portions of the first oxide layer residue 114a may have a slope R with respect to the substrate 100 because the reaction gas may remove a larger portion of the oxide layer 114 from an entrance portion of the second trench 115 as compared to a bottom portion of the second trench 115. The slope R may be about 85° to about 87° with respect to a lower surface, i.e., surface facing away from the first trenches 110, of the substrate 100.

Etching of the first oxide layer 114 with the reaction gas as described above may be advantageous in avoiding use of a bias voltage, thereby minimizing damage to the substrate. Further, etching with the reaction gas may be isotropic with respect to the silicon oxide ($SiO_2$) in the first oxide layer 114, thereby forming the second trenches 115 with sloped side surfaces, i.e., slopes R, without causing plasma damage to the substrate. In addition, etching with the reaction gas may facilitate etching only of the first oxide layer 114, thereby preventing or substantially minimizing etching of the pad nitride pattern 104, which in turn, may minimize non-uniform height defects of the pad nitride pattern 104.

Figure 4:
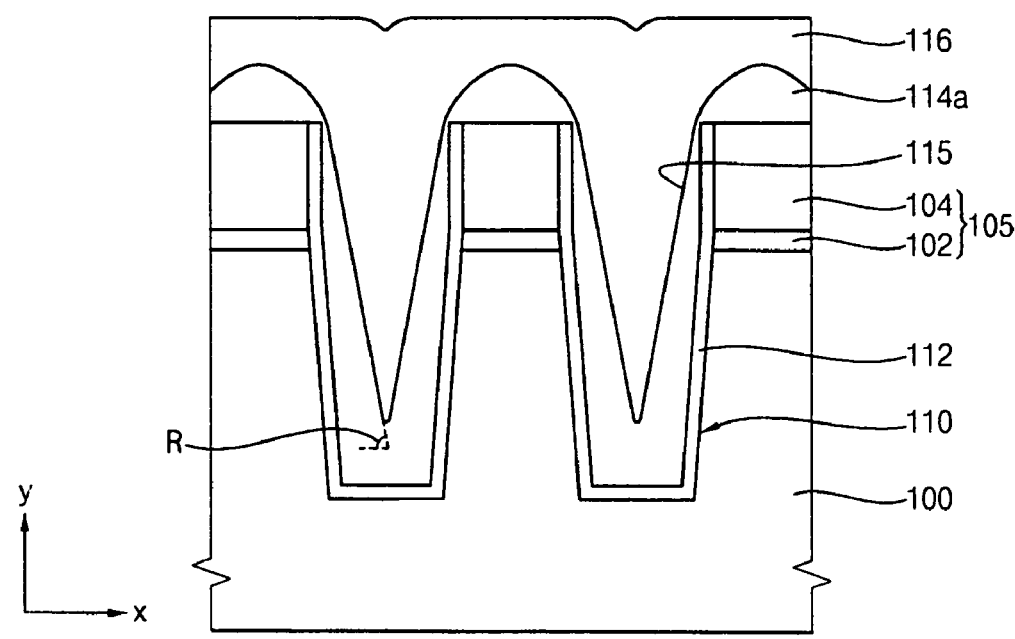

Referring to FIG. 4, a second oxide layer 116 may be formed on the first oxide layer residue 114a to fill up the second trenches 115. The second oxide layer 116 may be formed by, e.g., CVD using silicon oxide. The second oxide layer 116 may be formed of a substantially same material as the first oxide layer 114. The second oxide layer 116 may be formed to have a thickness of about 5,500 angstroms to about 6,500 angstroms along the y-axis.

After the second oxide layer 116 is formed, the second oxide layer 116 may be thermally treated to reflow the material of the second oxide layer 116 in the second trench 115. For example, the second oxide layer 116 may be heated at an atmosphere of water ($H_2O$) vapor at a temperature of about 700° C. to about 800° C. for about 30 minutes to perform densification thereof. That is, heating the second oxide layer 116 in the second trenches 115 may densify and reflow the material of the second oxide layer 116 to completely fill up any voids and/or seams in the second trenches 115 with silicon oxide. For example, if water vapor pressure triggers formation of seams in the first oxide layer residue 114a or second oxide layer 116 due to expansion of the silicon oxide, the second oxide layer 116 may be reflowed into the expanded portion so that the densified material of the second oxide layer 116 may be formed in the second trench 115. As such, the second oxide layer 116 may fill up the second trenches 115 without voids and/or seams.

Then, an additional densification process may be performed in order to densify the material of the second oxide layer 116 further by increasing the heat treatment temperature. For example, the second oxide layer 116 may be densified further by performing a heat treatment thereon at a temperature of about 900° C. to about 1,000° C. for about 30 minutes. The additional densification process of the second oxide layer 116 may be performed under an atmosphere of a nitrogen ($N_2$) gas.

Figure 5:
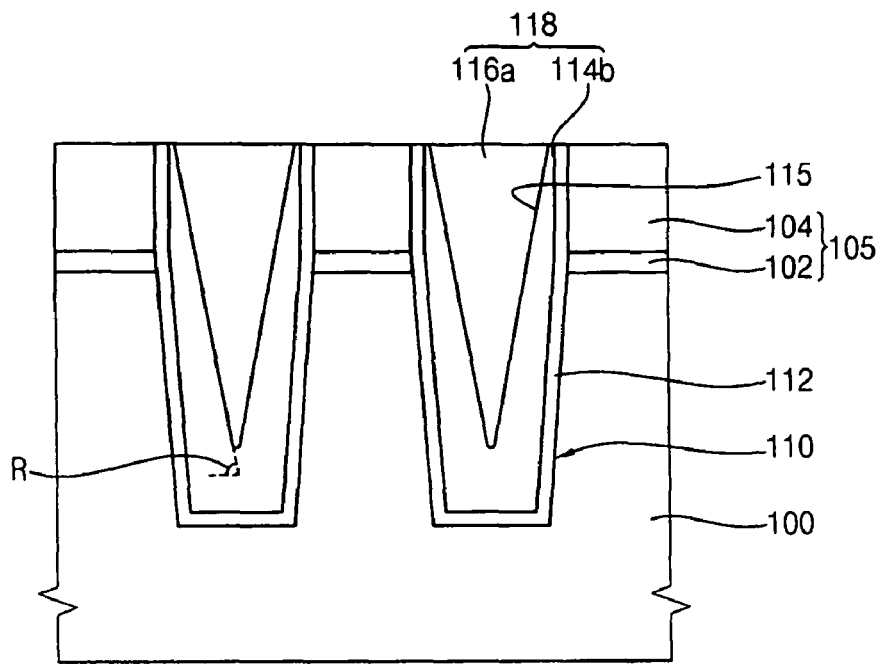

Referring to FIG. 5, a planarization process of the second oxide layer 116 and the first oxide layer residue 114a may be performed to expose an upper surface of the mask pattern 105 and to form first and second oxide patterns 116a and 114b in the first trenches 110. The second oxide pattern 116a and the first oxide pattern 114b may form a preliminary isolation layer 118 in the first trenches 110. The planarization process may include, e.g., a chemical mechanical polishing process.

Figure 6:
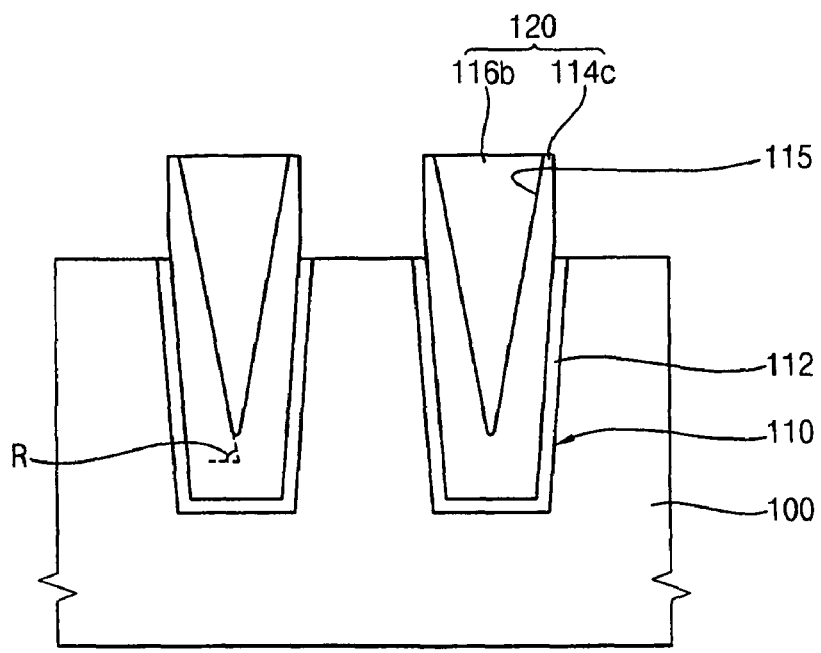

Referring to FIG. 6, the mask pattern 105 may be removed using, e.g., a wet etching solution, to expose a portion of the preliminary isolation layer 118 to define an isolation layer 120. More specifically, removal of the mask pattern 105 may include removal of the pad nitride pattern 104 before removal of the pad oxide pattern 102 via a wet etching solution, e.g., phosphoric acid ($H_3PO_4$). Then, the pad oxide pattern 102 may be removed via a wet etching process, e.g., by a LAL solution including ammonium fluoride, hydrogen fluoride, and deionized water, to selectively expose active regions of the substrate 100. Removal of the mask pattern 105 may define protruding portions of the first and second oxide patterns 114b and 116a. Upper portions of the first and second patterns 114b and 116a may be partially etched, so a height thereof may be reduced by a thickness of the pad oxide pattern 102 to form first and second oxide pattern residues 114c and 116b. An upper portion of the second oxide pattern 116b may be thermally treated to have low wet etching rate, thereby minimizing etching thereof. The first and second oxide pattern residues 114c and 116b may define the isolation layer 120.

The isolation layer 120 may protrude upward from the first trenches 110, i.e., the isolation layer 120 may have an upper surface at a higher height than the upper surface of the substrate 100 as determined with respect to the lower surface of the substrate 100. The isolation layer 120 may be formed in a device isolation region, so the upper surface of the isolation layer 120 may be higher than a floating gate to be formed.

Figure 7:
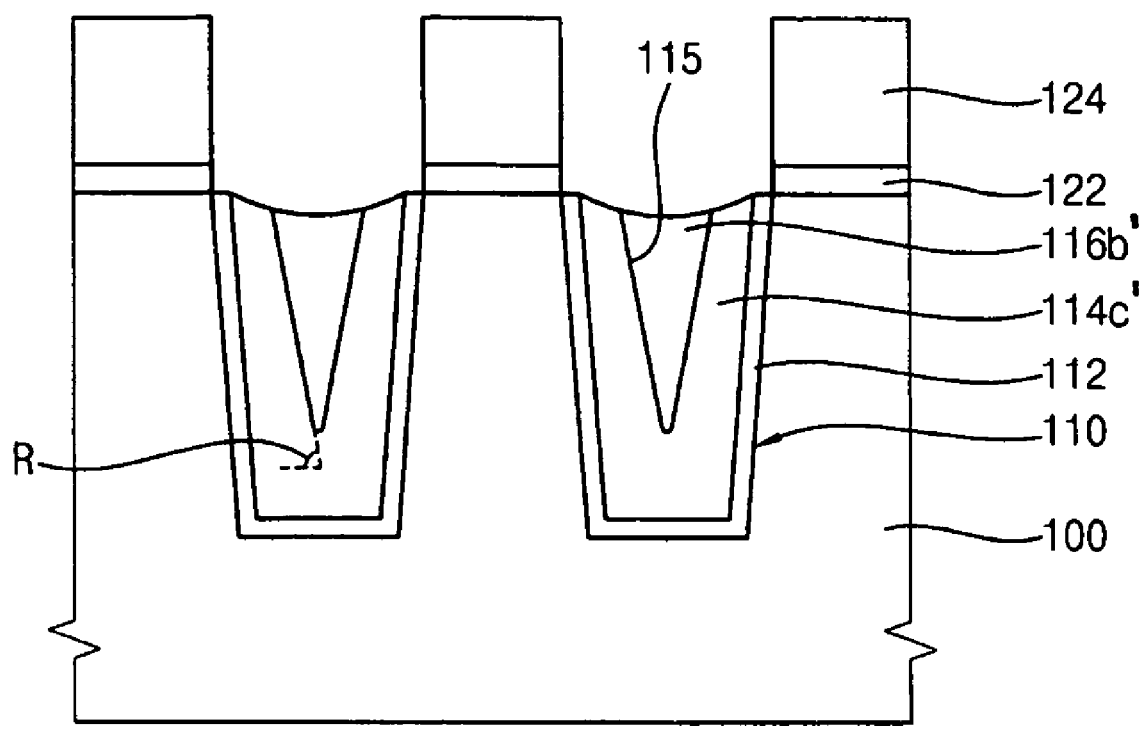

Referring to FIG. 7, a tunnel oxide layer 122 and a polysilicon layer (not shown) may be formed sequentially on the substrate 100 between adjacent portions of the isolation layer 120. The tunnel oxide layer 122 may include, e.g., one or more of a silicon oxide layer, a silicon oxide layer doped with fluorine, a silicon oxide layer doped with carbon, low dielectric constant (low-k) material layer, and so forth. The polysilicon layer may be formed by, e.g., an LPCVD process, to fill gaps between adjacent portions of the isolation layer 120 and to coat upper surfaces thereof.

The polysilicon layer may be processed by, e.g., a node isolation process or a chemical mechanical polishing process, to expose the upper surfaces of the isolation layer 120 and to form floating gate patterns 124 therebetween. Next, upper portions of the first and second oxide pattern residues 114c and 116b may be removed, so the first and second oxide pattern residues 114c' and 116b' may remain only inside the first trenches 110. In other words, an upper portion of the isolation layer 120 protruding above the upper surface of the substrate 100 may be removed. The upper portion of the isolation layer 120 may be removed via etching, e.g., a dry etching process and/or a wet etching process.

The method may further include forming a polysilicon layer (not shown) and a dielectric layer (not shown) on the substrate 100. The polysilicon and dielectric layers may be patterned to form a control gate pattern and a dielectric layer pattern on the floating gate pattern 124 to form a gate structure of a non-volatile memory device, e.g., a flash memory device, on the substrate 100.

According to embodiments of the present invention, the second trenches 115 defined by the first oxide layer residue 114a may be formed by providing the reaction gas to the first oxide layer 114 and by removing portions thereof to form the second trenches 115 having sloped sidewalls, e.g., at an angle of about 85° to about 87° with respect to the substrate 100. A second oxide layer may be filled densely in the second trenches 115, so formation of voids and/or seams may be substantially minimized. Further, by removing portions of the first oxide layer 114 via an isotropic etching process, over-etching may be substantially minimized as compared to, e.g., wet etching and/or plasma etching, thereby reducing substrate damage, e.g., active pitting phenomenon caused by dry etching using a bias voltage. Further, because a portion of the first oxide layer may be removed by isotropic etching, the entrance of the second trenches may be enlarged to form sloped sidewalls, thereby facilitating deposition of the second oxide layer therein without voids and/or seams. In addition, planarizing the second oxide layer may facilitate formation of a stable oxide layer without voids and/or seams therein, thereby improving reliability and operability of a semiconductor device.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

In addition, as used herein, the singular forms "a," "an," and "the" are intended to include the plural forms as well, unless the context clearly indicates otherwise.

Unless otherwise defined, all terms used herein have the same meaning as commonly understood by one of ordinary skill in the art.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of filling a trench, the method comprising:
forming at least one first trench to extend from an upper surface of a substrate in a downward direction;
forming a first oxide layer conformably on the substrate, such that the first trench is partially filled with the first oxide layer;
removing a portion of the first oxide layer by reacting a reaction gas including fluorine and nitrogen with the first oxide layer to form a partially etched first oxide layer, the partially etched first oxide layer defining at least one second trench; and
forming a second oxide layer on the partially etched first oxide layer, such that the second trench is filled with the second oxide layer,
wherein removing a portion of the first oxide layer includes forming first byproducts via a reaction between the first oxide layer and the reaction gas, reacting the first byproducts with the reaction gas to form second byproducts, and removing the second byproducts.

2. The method as claimed in claim 1, wherein the reaction gas includes a hydrofluoric acid (HF) vapor and an ammonia ($NH_3$) gas.

3. The method as claimed in claim 1, wherein a fluid flow ratio of the ammonia ($NH_3$) gas to the hydrofluoric acid (HF) vapor is about 1:0.8 to about 1:1.2.

4. The method as claimed in claim 1, wherein forming the first byproducts includes forming fluorinated silicon ($SiF_4$), and forming the second byproducts includes forming ammonium fluorosilicate (($NH_4)_2SiF_6$).

5. The method as claimed in claim 1, wherein forming a partially etched first oxide layer to define the second trench is performed at a temperature of about 30° C. to about 40° C.

6. The method as claimed in claim 1, wherein forming a partially etched first oxide layer to define the second trench is performed at a pressure of about 50 mTorr to about 100 mTorr.

7. The method as claimed in claim 1, wherein the first oxide layer and the second oxide layer include one or more of undoped silicate glass (USG) layer, an $O_3$-tetraethylorthosilicate ($O_3$-TEOS) layer, a thermal oxide layer, a phosphosilicate glass (PSG) layer, a borophosphosilicate glass (BPSG) layer, and/or a high density plasma (HDP) oxide layer.

8. The method as claimed in claim 1, wherein removing a portion of the first oxide layer to form a partially etched first oxide layer includes defining the second trench to have a sidewall slope of about 85° to about 87°.

9. The method as claimed in claim 1, wherein forming the first oxide layer includes setting a width of the first trench and a thickness of the first oxide layer to have a ratio of about 1:0.2 to about 1:0.8.

10. The method as claimed in claim 9, wherein forming the first trench includes forming a trench having a ratio of the width and a depth of about 1:3 to about 1:20.

11. The method as claimed in claim 1, wherein forming the second oxide layer includes forming the second oxide layer to have a thickness of about 5,500 angstroms to about 6,500 angstroms.

12. The method as claimed in claim 1, further comprising thermally treating the second oxide layer to reflow the second oxide layer into the second trench.

13. The method as claimed in claim 1, wherein forming the first trench includes forming a mask pattern on the substrate and etching the substrate using the mask pattern.

14. The method as claimed in claim 13, further comprising planarizing the second oxide layer to expose the mask pattern.

15. The method as claimed in claim 13, wherein forming the mask pattern includes stacking a pad oxide pattern and a pad nitrogen pattern on the substrate.

* * * * *